United States Patent
Krell

(10) Patent No.: US 10,772,221 B2
(45) Date of Patent: Sep. 8, 2020

(54) DISPLAY DEVICE FOR A MOTOR VEHICLE, METHOD FOR PRODUCING A DISPLAY DEVICE FOR A MOTOR VEHICLE

(71) Applicant: Volkswagen Aktiengesellschaft, Wolfsburg (DE)

(72) Inventor: Thomas Krell, Wolfsburg (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 14 days.

(21) Appl. No.: 16/021,843

(22) Filed: Jun. 28, 2018

(65) Prior Publication Data

US 2019/0008056 A1 Jan. 3, 2019

(30) Foreign Application Priority Data

Jun. 28, 2017 (DE) .......................... 10 2017 210 938

(51) Int. Cl.
*H05K 5/00* (2006.01)
*B60R 11/02* (2006.01)
(Continued)

(52) U.S. Cl.
CPC ........... *H05K 5/0017* (2013.01); *B60K 35/00* (2013.01); *B60R 11/0235* (2013.01); *F16B 2/12* (2013.01); *G06F 3/1446* (2013.01); *G09F 9/3026* (2013.01); *H05K 7/18* (2013.01); *B60K 2370/774* (2019.05); *B60K 2370/81* (2019.05); *B60K 2370/816* (2019.05); *B60K 2370/822* (2019.05); *F16B 5/0233* (2013.01)

(58) Field of Classification Search
CPC ...... H05K 5/0017; B60K 37/02; B60K 37/04; B60K 35/00
USPC .............................. 248/125.2, 917, 919, 920
See application file for complete search history.

(56) References Cited

U.S. PATENT DOCUMENTS 5,904,328 A * 5/1999 Leveridge .............. F16M 11/10
248/124.1
7,621,500 B2 * 11/2009 Ishizaki .............. F16C 11/0661
248/371

(Continued)

FOREIGN PATENT DOCUMENTS

DE 102011076673 A1 12/2012 ............. B60K 35/00
DE 102011082467 A1 3/2013 ............. B60K 35/00

(Continued)

OTHER PUBLICATIONS

Extended European Search Report, Application No. 18173935.0, 7 pages, dated Oct. 24, 2018.

(Continued)

*Primary Examiner* — Steven M Marsh
(74) *Attorney, Agent, or Firm* — Slayden Grubert Beard PLLC

(57) ABSTRACT

A display device for a motor vehicle, as well as a method for producing a display device for a motor vehicle. The display device comprises two or more displays, wherein the two or more displays have display housings and are optically bonded to a respective cover pane. A holding frame connects the two or more displays to each other. By means of at least one compensating element of the display device, the two or more displays can be aligned relative to each other.

19 Claims, 8 Drawing Sheets

(51) Int. Cl.
  *B60K 35/00* (2006.01)
  *F16B 2/12* (2006.01)
  *G06F 3/14* (2006.01)
  *G09F 9/302* (2006.01)
  *H05K 7/18* (2006.01)
  *F16B 5/02* (2006.01)

(56) References Cited

U.S. PATENT DOCUMENTS

| | | | | |
|---|---|---|---|---|
| D624,084 S | * | 9/2010 | Scheper | D14/452 |
| 8,235,335 B2 | * | 8/2012 | Sato | G02F 1/13336 |
| | | | | 16/367 |
| 8,777,290 B1 | | 7/2014 | Boese | 296/70 |
| 8,844,180 B2 | | 9/2014 | Kludt et al. | 40/605 |
| 9,446,665 B2 | | 9/2016 | Abel et al. | |
| 2004/0041062 A1 | * | 3/2004 | Ozolins | F16M 11/08 |
| | | | | 248/122.1 |
| 2005/0146607 A1 | * | 7/2005 | Linn | B60R 1/00 |
| | | | | 348/148 |
| 2006/0082518 A1 | * | 4/2006 | Ram | G06F 3/1446 |
| | | | | 345/1.1 |
| 2006/0238967 A1 | * | 10/2006 | Carson | B60R 11/0235 |
| | | | | 361/679.04 |
| 2007/0000849 A1 | | 1/2007 | Lutz et al. | 211/26 |
| 2013/0334376 A1 | * | 12/2013 | Moscovitch | B60R 11/02 |
| | | | | 248/125.1 |
| 2016/0193923 A1 | | 7/2016 | Kim et al. | 296/70 |
| 2017/0003787 A1 | * | 1/2017 | Beraud | B60K 35/00 |
| 2017/0307909 A1 | | 10/2017 | Moeller et al. | |
| 2018/0343752 A1 | * | 11/2018 | Delmaere | B60K 35/00 |

FOREIGN PATENT DOCUMENTS

| | | | | |
|---|---|---|---|---|
| DE | 102013013356 A1 | 4/2014 | | B60K 37/00 |
| DE | 102014019293 A1 | 6/2016 | | G01D 11/24 |
| EP | 3029657 A1 | 6/2016 | | G06F 3/14 |
| JP | 08268114 A | 10/1996 | | B60K 35/00 |
| KR | 20170067743 A | 6/2017 | | B60K 35/00 |

OTHER PUBLICATIONS

Korean Office Action, Application No. 2019057793737, 5 pages, dated Aug. 11, 2019.
German Office Action, Application No. 102017210938.6, 5 pages, dated Jan. 19, 2018.
European Office Action, Application No. 18173935.0, 5 pages, dated Dec. 17, 2019.

* cited by examiner

DISPLAY DEVICE FOR A MOTOR VEHICLE, METHOD FOR PRODUCING A DISPLAY DEVICE FOR A MOTOR VEHICLE

CROSS-REFERENCE TO RELATED APPLICATIONS

This application claims priority to DE Application No. 10 2017 210 938.6 filed Jun. 28, 2017, the contents of which are hereby incorporated by reference in their entirety.

TECHNICAL FIELD

The present invention relates to a display device for a motor vehicle, as well as to a method for producing a display device for a motor vehicle, in particular a display device with two or more displays. The invention furthermore relates to a motor vehicle in which a display device according to the invention is used.

As part of the increasing use of displays in motor vehicles, frequently not just one individual display is installed, for example as a display device for an instrument cluster, but rather a group of displays. Accordingly, for example, a double display consisting of a digital instrument cluster and an infotainment display can be installed.

With such double displays, the individual displays are installed flush next to each other in the dashboard of the vehicle and work as a continuous display panel.

An initial option of achieving this is to arrange two displays behind a common cover pane. Without additional measures, reflections and double images arise from the cover pane, however, that strongly impair the legibility of the display. To a certain extent, this can be attenuated by using an anti-glare cover pane.

Better results can be attained if the two displays are optically bonded to the common cover pane, i.e., are adhered glass-clear. However, this approach increases the reject rate in production and prevents a multiple supplier strategy for the two displays. Moreover, in the case of repairs of defects, both displays must be exchanged which strongly increases the repair cost.

Another option consists of positioning the individual displays that are each bonded to a cover pane in a common support frame comparable to a picture frame. However, this cannot achieve a flush appearance of the display since another component, the support frame, always lies between the displays. Of course the color of the support frame can be adapted and configured as flat as possible in order to minimize the jump from the display surface to the surface of the support frame; however, this does not yield an appearance like a contiguous part.

Finally, the displays that are each optically bonded to a cover pane can be fastened next to each other on a common holder. However, this is not reliably feasible due to the given installation conditions and the tolerances of the components, in particular perpendicular to the display surface.

EP 3 029 657 A1 describes a display system with regard to video walls composed of individual displays. The display system comprises a plurality of display devices and a rack on which the display devices are mounted. The rack has a base with which the rack can be set up on a horizontal surface, as well as a series of interconnecting frames. The interconnecting frames are designed to each be mounted on a display device and are configured so that the relative alignment of the display devices can be adjusted. Rotatable adjusting nuts are provided for the flush alignment of the surfaces of the display devices, and they interact with corresponding fixed adjusting screws.

With regard to electronic display boards, U.S. Pat. No. 8,844,180 B2 describes an electronic sign that is composed of a plurality of frame cabinets. The frame cabinets are each connected to horizontally or vertically adjacent frame cabinets. The connection is provided by special connecting pieces. LED displays are mounted in the frame cabinets. The frame cabinets and the connecting pieces are configured so that the produced connections are self-aligning.

SUMMARY

It is an object of the invention to present a display device for a motor vehicle in which the individual displays can be installed flush next to each other and work like a continuous display panel. It is another object of the invention to present a method for producing such a display device.

The objects are achieved with a display device and by a method having the features of the claims. Embodiments of the invention are the subject matter of the dependent claims and the following description.

According to a first exemplary aspect, a display device comprises two or more displays, wherein the two or more displays have display housings and are optically bonded to a respective cover pane. A holding frame connects the two or more displays to each other. By means of at least one compensating element of the display device, the two or more displays can be aligned relative to each other.

According to another exemplary aspect, a method for producing a display device with two or more displays for a motor vehicle, wherein the two or more displays have display housings and are optically bonded to a cover pane, comprises the steps:

fastening a first display to a holding frame; and
 aligning the first display relative to a second display that is connected to the holding frame by means of at least one compensating element of the display device.

The use of one or more compensating elements makes it possible to install displays with respective cover panes precisely flush next to each other despite existing tolerances. The nearly tolerance-free installation of the displays relative to each other causes the displays to work like a contiguous display panel. During installation, the displays may be aligned correctly by means of an installation gauge and then connected to the holding frame.

BRIEF DESCRIPTION OF THE DRAWINGS

Additional features and embodiments of the present invention are described in the following description and the appended claims.

Figure 1:
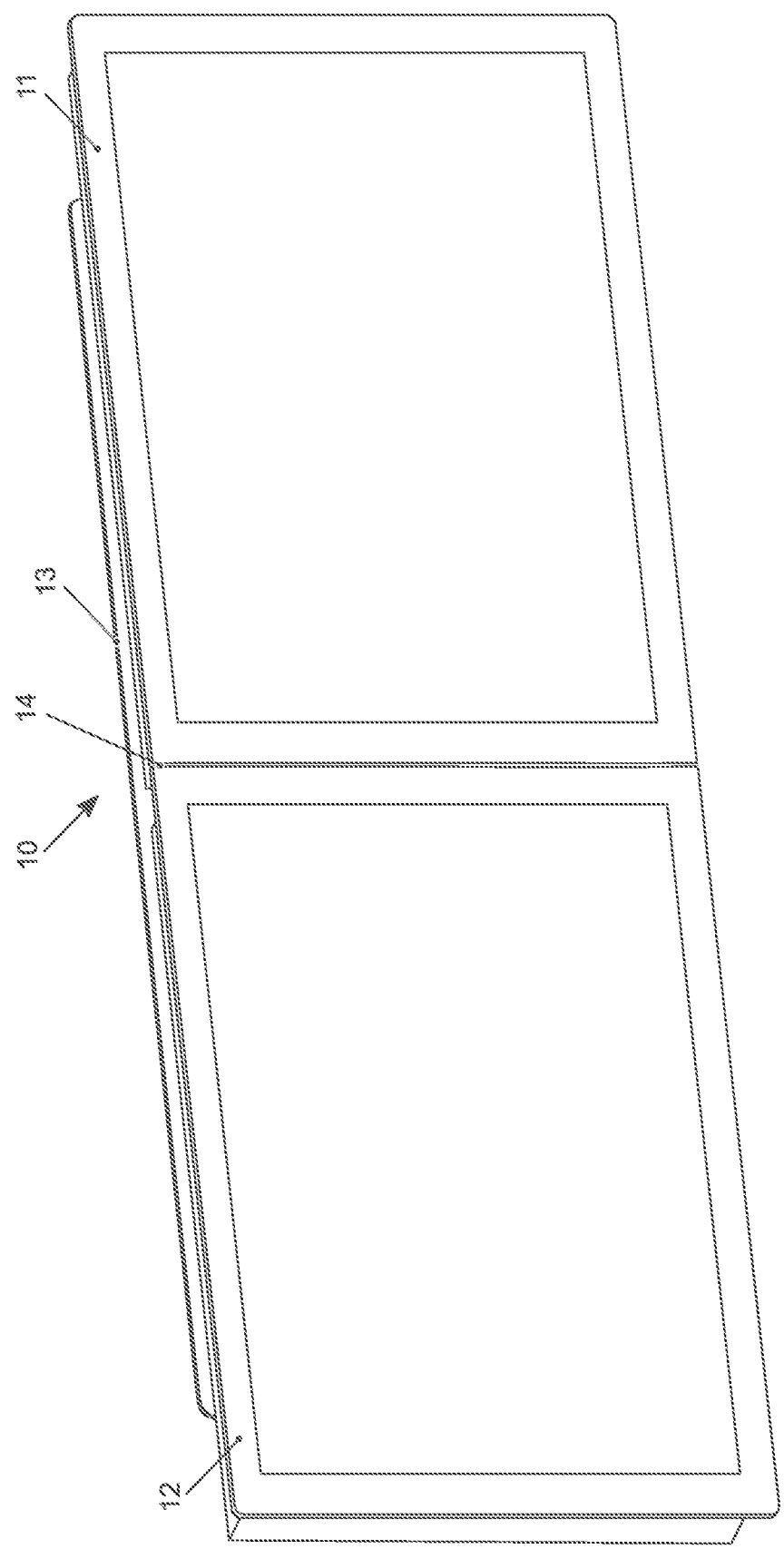
FIG. 1 schematically portrays a front view of a display device according to an embodiment of the invention.

According to some embodiments, each of the two or more displays are adjustable relative to the holding frame. In this manner, tolerances of the holding frame can also be compensated in addition to compensating tolerances of the individual displays relative to each other.

According to some embodiments, at least one of the two or more displays cannot be adjusted relative to the holding frame. In this case, the holding frame is either a component of the display housing of one of the two or more displays or is unadjustably connected to the display housing of one of the two or more displays. The unadjustable display functions in this case as a reference for the adjustment of the other displays. Of course tolerances of the holding frame can only be compensated slightly with this approach; conversely, by reducing the elements to be adjusted, overall adjustment is simplified.

According to some embodiments, the at least one compensating element comprises a threaded bush in one of the display housings in which an adjusting screw engages. For example, a compensating bush for tolerance compensation is arranged between the threaded bush and the adjusting screw. Such a compensating bush is, for example, known from EP 1 304 489 B1. In this embodiment, a high clamping force and rigidity of the connection is achieved that can reliably bear the weight of the components, even under the influence of vibrations, temperature fluctuations and aging. In addition, the components can be aligned automatically relative to each other perpendicular to the display surface while screwing by using the compensating element, which shortens the installation process.

According to some embodiments, the at least one compensating element comprises a threaded rod with lock nuts. A high clamping force and rigidity of the connection is also achieved with this embodiment. Moreover, this embodiment can be implemented very economically.

According to some embodiments, the at least one compensating element comprises a fastening lug of the holding frame to which one of the display housings is laterally fastened, for example with an adjusting screw. A threaded bush or an inserted nut in the display housing can be provided for the adjusting screw. Given a certain amount of play in the hole for the adjusting screw in the fastening lug, tolerance compensation perpendicular to the display surface and along an axis parallel to the display surface is possible. At the same time, the compensating element is held very easily so that it can be realized economically.

According to some embodiments, contact surfaces between a display housing and the holding frame have an adhesion. In this manner, a secure connection of the components over the life of the display device is also ensured by setting processes even with the loss of clamping force.

According to some embodiments, the holding frame has fastening points for a dashboard. With this solution, the holding frame not only serves to connect the displays to each other, but simultaneously also serves to fasten the entire display device in the dashboard. This dual use of the holding frame reduces the number of components to be installed.

In some embodiments, a display device as described herein is used in a vehicle, in particular a motor vehicle.

To better understand the principles of the present invention, further embodiments will be explained in the following in greater detail with reference to the figures. Of course, the invention is not restricted to these embodiments, and the described features can also be combined or modified without departing from the invention's scope of protection as defined in the appended claims.

Figure 2:
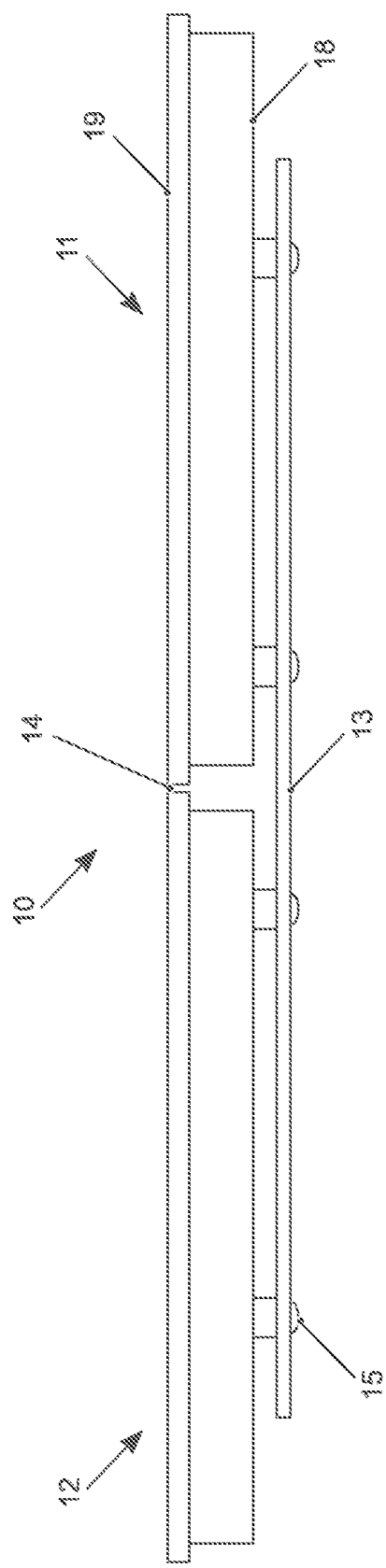
FIG. 2 schematically portrays a side view of the display device from FIG. 1.

FIG. 1 schematically portrays a front view of a display device 10 for a motor vehicle according to an embodiment. A side view of the display device 10 is depicted in FIG. 2. The display device 10 is a dual display comprising a first display 11 and a second display 12. Each of the displays 11, 12 has a display housing 18 and is overbuilt by a cover pane 19 that is optically bonded to the respective display 11, 12. A holding frame 13 which is connected to the display housings 18 bears the two displays 11, 12 and connects them to each other. By means of one or more compensating elements 15, a compensation of the tolerance between the cover panes 19 is possible, i.e., the displays 11, 12 can be aligned relative to each other. With the alignment, a flush surface transition and an even joint 14 between the cover panes 19 are attained. The compensating element 15 can, for example, be threaded bushes in the display housings 18 that interact with corresponding adjusting screws. In FIG. 1 and FIG. 2, both displays 11, 12 can be adjusted relative to the holding frame 13. It is however also possible for one of the displays 11, 12 to be connected to the holding frame 13 without an adjustment option. In this case, the holding frame 13 can also be an integral component of the corresponding display housing 18.

Figure 3:
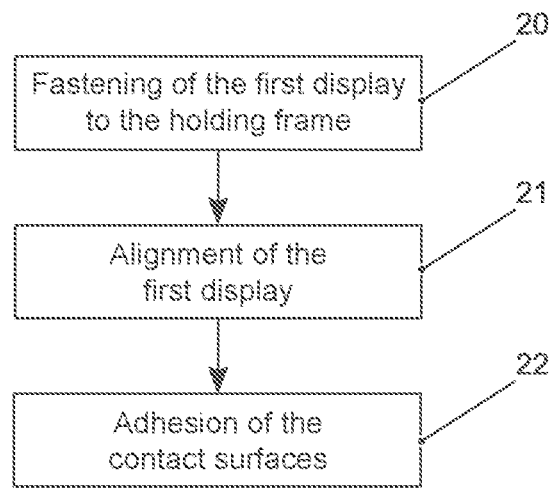
FIG. 3 schematically portrays a method for producing a display device according to an embodiment of the invention.

FIG. 3 schematically portrays a method for producing a display device with two or more displays for a motor vehicle, wherein the two or more displays have display housings and are optically bonded to a cover pane. In a first step, a first display is fastened to a holding frame 20. Then the first display is aligned 21 relative to a second display that is connected to the holding frame. The alignment 21 is carried out by means of at least one compensating element of the display device. To ensure the connection over the life of the display device, optionally an adhesion 22 of all or some contact surfaces between the display housings and the holding frame can be carried out. The second display can be adjustably or unadjustably connected to the holding frame. It is likewise possible for the holding frame to be a component of the display housing of the second display.

Figure 4:
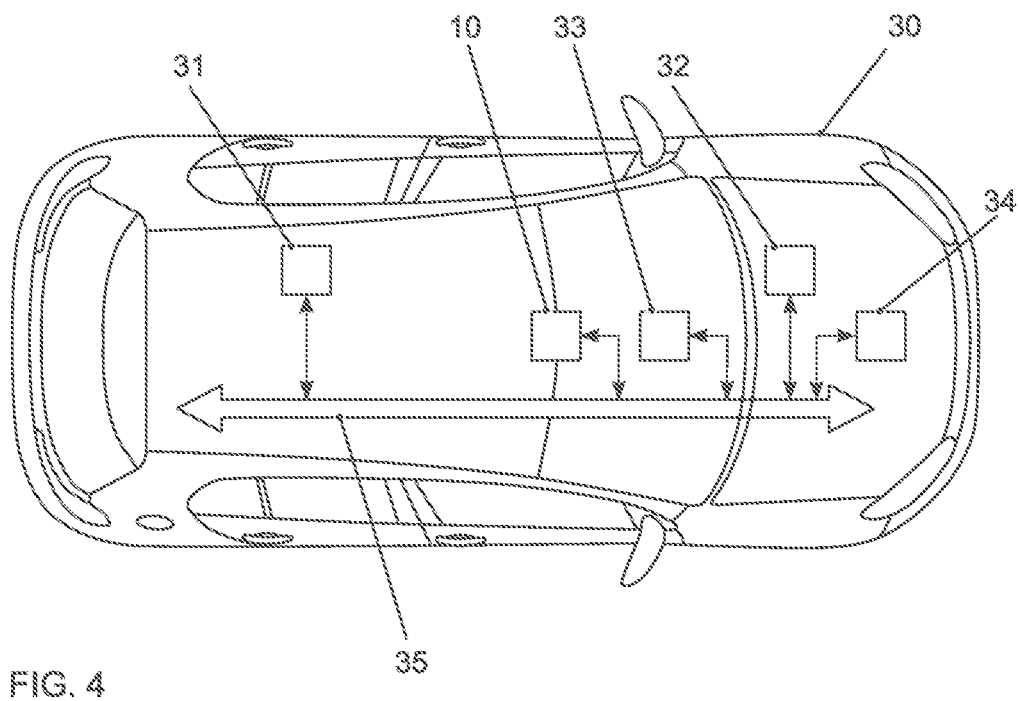
FIG. 4 schematically depicts a motor vehicle in which a display device according to an embodiment of the invention is installed.

FIG. 4 schematically depicts a motor vehicle 30 in which a display device 10 according to an embodiment is installed. The motor vehicle 30 has inter alia a navigation system 31, an infotainment system 32 and a graphics unit 33 for controlling the display device 10. Moreover, a memory 34 can be provided. The data provided by the navigation system 31 and the infotainment system 32 are transmitted by a network 35 to the graphics unit 33. The graphic displays generated by the graphics unit 33 are output by means of the display device 10. In the FIG., the graphics unit 33 is an independent component. It can however also be integrated into another component such as the infotainment system 32 or the display device 10.

In the following, further embodiments will be explained with reference to FIGS. 5 to 10.

Figure 5:
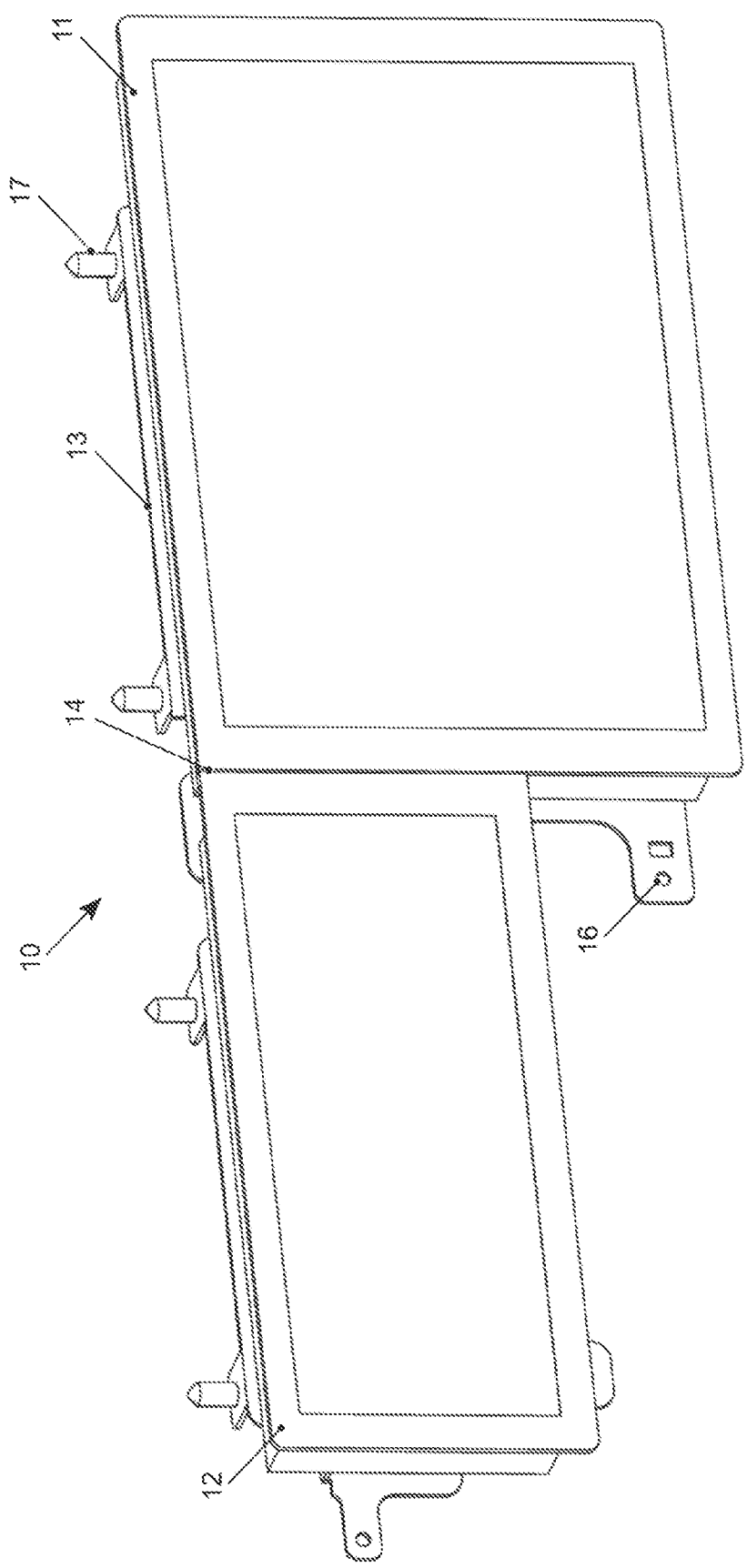
FIG. 5 portrays a front view of an embodiment of the display device.
Figure 6:
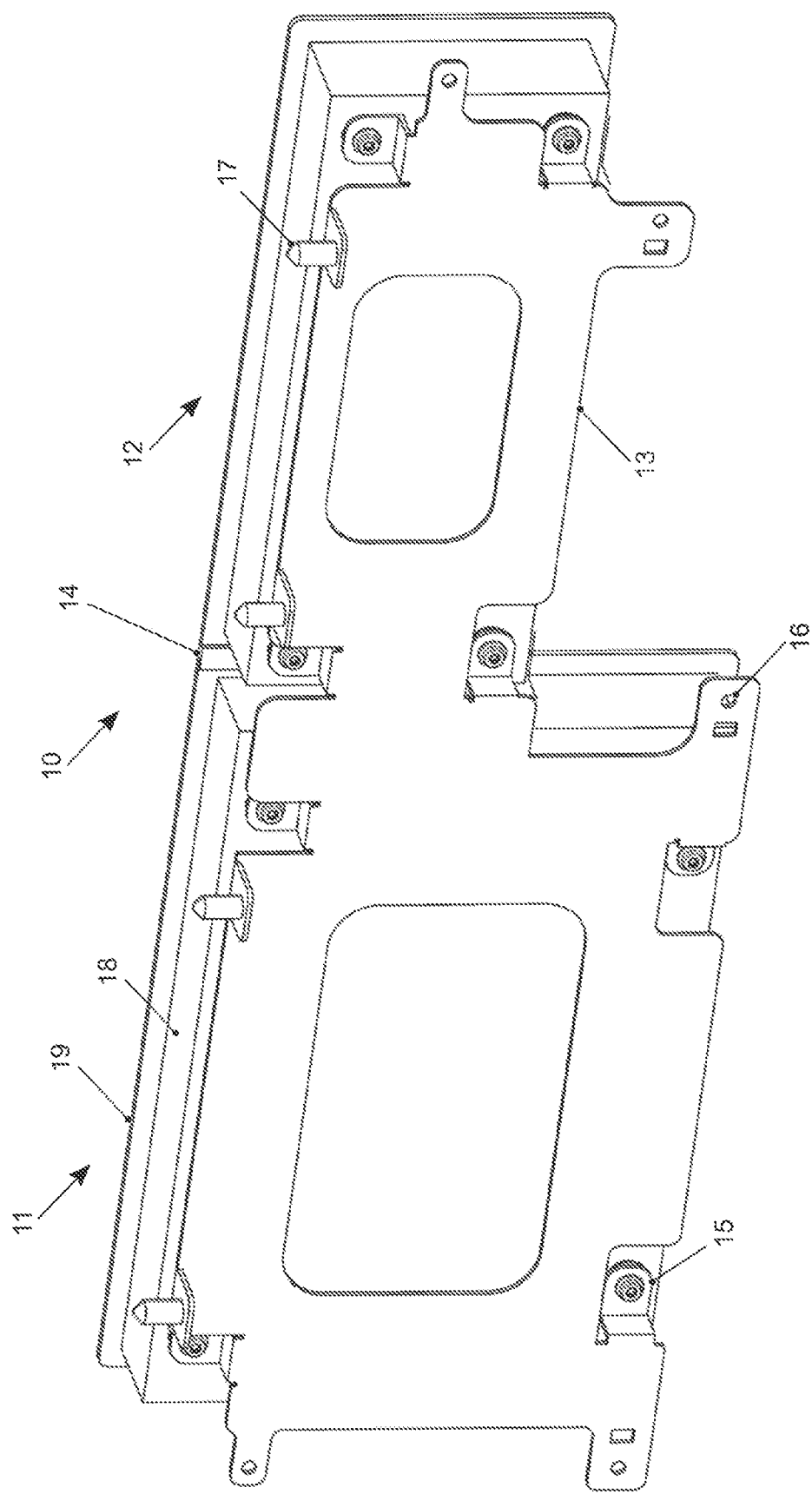
FIG. 6 portrays a rear view of the display device from FIG. 5.

FIG. 5 portrays a front view, and FIG. 6 the associated rear view, of an embodiment of the display device 10. In this example, the display device 10 is an assembly consisting of a display control as the first display 11, such as an infotainment display, and a digital instrument cluster as the second display 12. The digital instrument cluster can, for example, be a fully programmable instrument cluster. The two displays 11, 12 are different sizes in the example, but they can of course also have the same size. Both displays 11, 12 are optically bonded to a respective cover pane 19. The display housing 18 of the displays 11, 12 are connected to a holding frame 13 that connects and bears the two displays 11, 12 to each other. The two displays 11, 12 and the holding frame 13 are subject to tolerances in all spatial directions. Installing these elements with the usual centering would lead the cover panes to not be flush with each other; the joint 14 between the devices would be uneven. To ensure a flush surface transition between the glass surfaces of the cover panes 19 and an even joint between the cover panes 19, the two displays 11, 12 are connected adjustably to the holding frame 13. The displays 11, 12 are adjusted relative to each other by means of compensating elements 15. For installation in the motor vehicle, the holding frame has a series of fastening points 16 with the assistance of which the holding frame 13 can be connected to an instrument panel. Moreover, installation pins 17 can be provided to facilitate installation.

Figure 7:
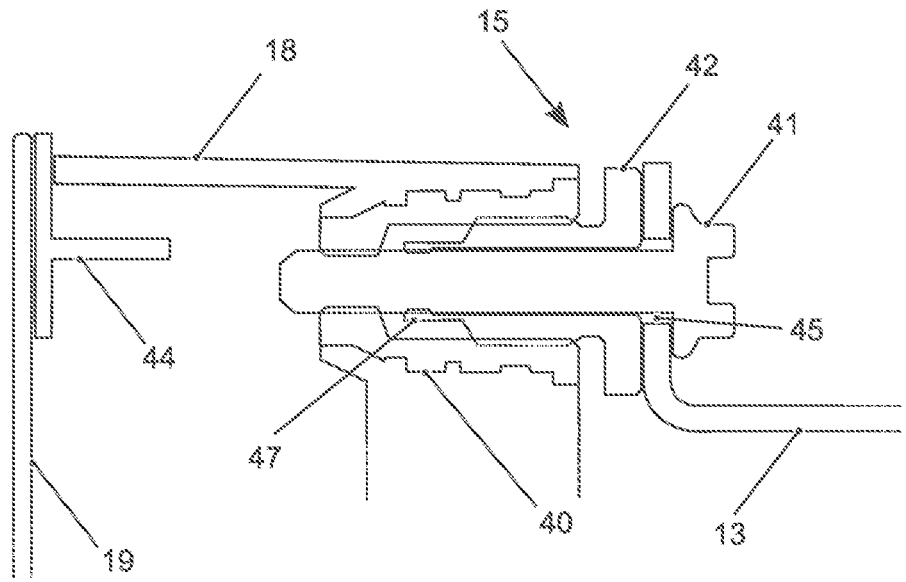
FIG. 7 portrays a design of a compensating element in detail.

FIG. 7 portrays an exemplary design of a compensating element 15 in detail. The cover pane 19 is held by a display carrier 44 that is connected to the display housing 18. An overmolded threaded bush 40 is placed into the display housing 18 in which an adjusting screw 41 engages. Between the adjusting screw 41 and threaded bush 40, there is a compensating bush 42. By means of the adjusting screw 41 and the compensating bush 42, the display housing 18 is fastened to the holding frame 13. The compensating bush 42 has a left-hand outer thread that interacts with a corresponding inner thread of the threaded bush 40. The compensating bush 42 moreover has a clamping section 47 that is connected by a friction lock to the adjusting screw 41 and can be rotated relative to the adjusting screw 41 after overcoming the friction lock. Upon being screwed in, the adjusting screw 41 accordingly also rotates the compensating bush 42 by means of the friction lock, whereby the compensating bush 42 screws out of the threaded bush 40 opposite the direction of insertion. Once the compensating bush 42 is placed on the holding frame 13, the friction lock is overcome, and the adjusting screw 41 engages in a screwed connection with a right-hand inner thread of the threaded bush 40 or the compensating bush 42. This enables a tolerance compensation perpendicular to the display surface. For example, an adjustment path of ±2 mm can be provided. An alignment of the display parallel to the display surface is enabled by play in the hole 45 for the adjusting screw 41 in the holding frame 13. Alternative to the combination of the threaded bush 40 and the adjusting screw 41, the compensating element 15 can also be formed by threaded rods and lock nuts.

Figure 8:
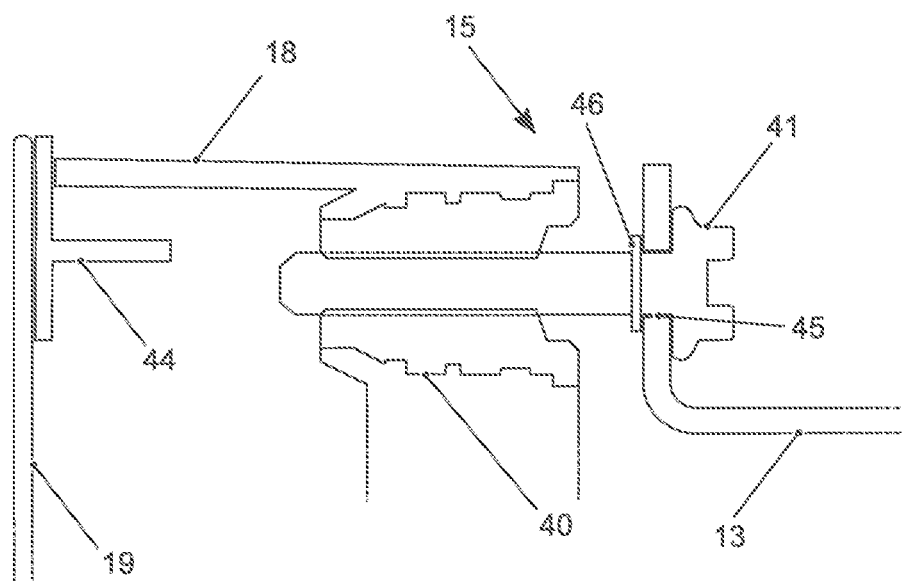
FIG. 8 portrays an alternative design of a compensating element in detail.

FIG. 8 portrays an alternative design of a compensating element 15. Again, the cover pane 19 is held by a display carrier 44 that is connected to the display housing 18. An overmolded threaded bush 40 is placed into the display housing 18 in which an adjusting screw 41 engages. In this design, the hole 45 is largely designed without play. The adjusting screw 41 is fixed by a snap ring 46. The display housing 18 is held by the adjusting screw 41 relative to the holding frame 13. This also enables a tolerance compensation perpendicular to the display surface. For example, an adjustment path of ±2 mm can be provided.

Figure 9:
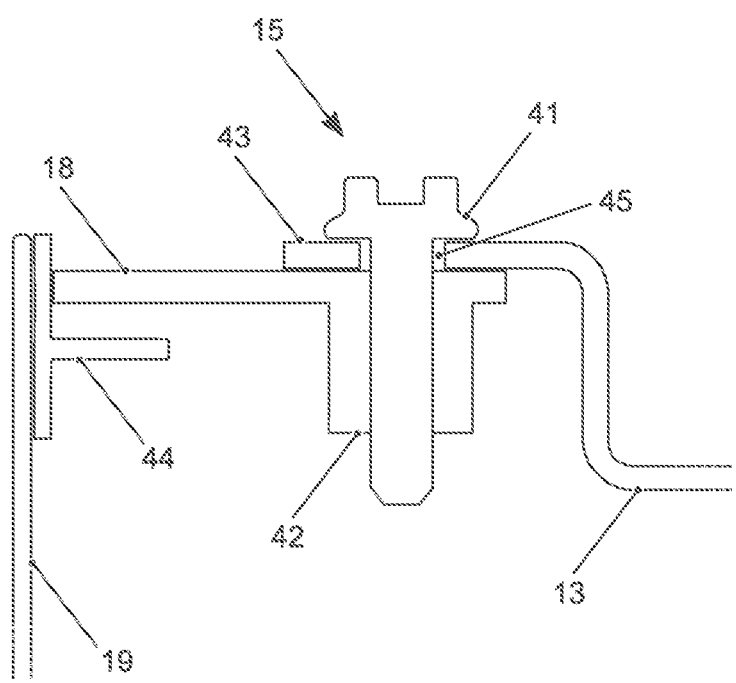
FIG. 9 portrays another alternative design of a compensating element in detail.

FIG. 9 portrays another alternative design of a compensating element 15. As before, the cover pane 19 is held by a display carrier 44 that is connected to the display housing 18. In this example, the adjustable connection between the display and the holding frame 13 is achieved by a fastening lug 43 that is screwed with an adjusting screw 41 laterally to the display housing 18. For this purpose, a threaded bush or an inserted nut in the display housing 18 can be provided for the adjusting screw 41. Given a certain amount of play in the hole 45 for the adjusting screw 41 in the fastening lug 43, tolerance compensation perpendicular to the display surface and along an axis parallel to the display surface is possible.

Figure 10:
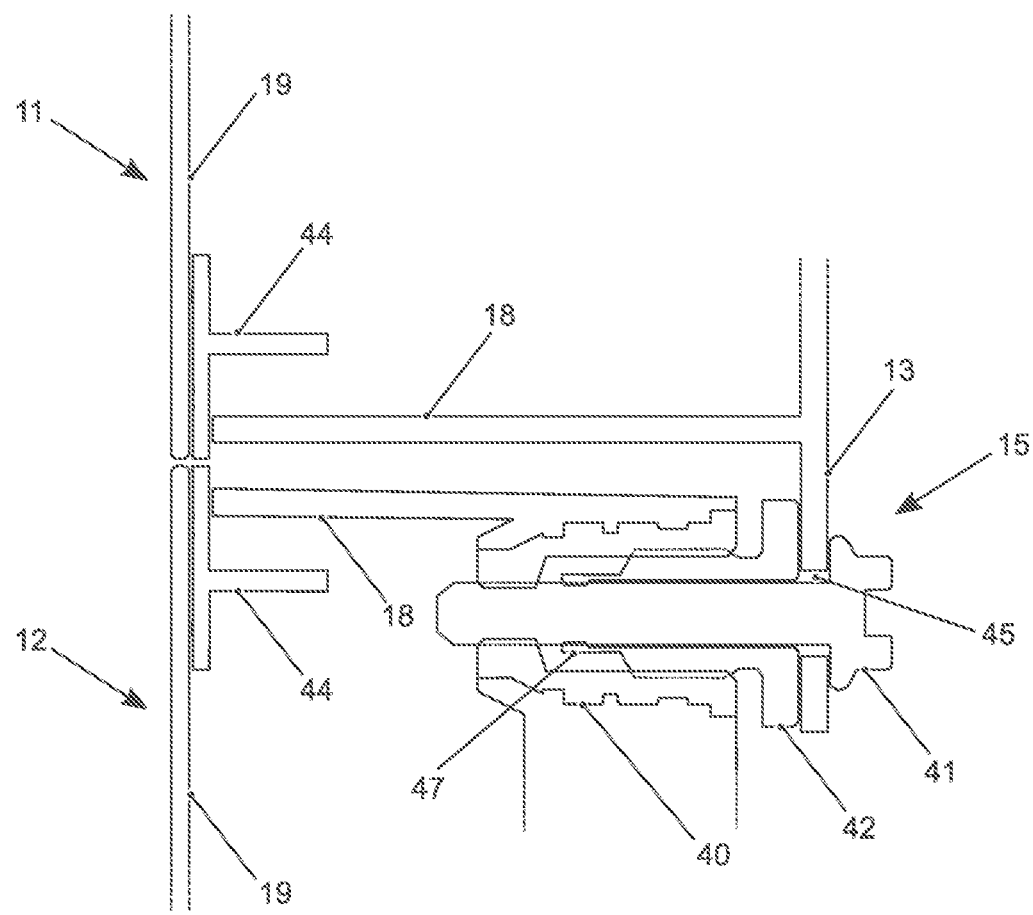
FIG. 10 portrays a detail of another embodiment of the display device.

FIG. 10 portrays a detail of another embodiment of the display device. In this embodiment, the holding frame 13 is integrated into the display housing 18 of the first display 11, i.e., the first display 11 cannot be adjusted. The cover panes 19 are held by associated display carriers 44 that are connected to the display housings 18. An overmolded threaded bush 40 is placed into the display housing 18 of the second display 12 in which an adjusting screw 41 also engages. Between the adjusting screw 41 and the threaded bush 40, there is a compensating bush 42 already known from FIG. 7. By means of the adjusting screw 41 and the compensating bush 42, the display housing 18 of the second display is fastened to the holding frame 13. In this manner, a compensation of the tolerance is enabled of the second display 12 relative to the first display 11 perpendicular to the display surface. For example, an adjustment path of ±2 mm can also be provided here. An alignment of the second display 12 relative to the first display 11 parallel to the display surface is moreover enabled by play in the hole 45 for the adjusting screw 41 in the holding frame 13.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module or other unit or device may fulfil the functions of several items recited in the claims.

The mere fact that certain measures are recited in mutually different dependent claims or embodiments does not indicate that a combination of these measured cannot be used to advantage. Any reference signs in the claims should not be construed as limiting the scope.

REFERENCE SIGN LIST

10 Display device
11 First display
12 Second display
13 Holding frame
14 Joint
15 Compensating element
16 Fastening point
17 Installation pin
18 Display housing
19 Cover pane
20 Fastening of the first display to the holding frame
21 Alignment of the first display
22 Adhesion of the contact surfaces
30 Motor vehicle
31 Navigation system
32 Infotainment system
33 Graphics unit
34 Memory
35 Network
40 Threaded bush
41 Adjusting screw
42 Compensating bush 43 Fastening lug
44 Display carrier
45 Hole
46 Snap ring
47 Clamping section

What is claimed is:

1. A display device for a dashboard of a motor vehicle comprising:
two or more displays, wherein the two or more displays have display housings and are optically bonded to a respective cover pane; and
a holding frame that connects the two or more displays to each other;
wherein the holding frame has fastening points for the dashboard; and
wherein the display device has at least one compensating element for aligning the two or more displays flush next to each other in the dashboard of the motor vehicle; and
wherein the compensating element allows at least linear positioning of the two or more displays relative to each other along an axis, perpendicular to the cover pane.

2. The display device according to claim 1, wherein each of the two or more displays can be adjusted relative to the holding frame.

3. The display device according to claim 1, wherein at least one of the two or more displays cannot be adjusted relative to the holding frame.

4. The display device according to claim 3, wherein the holding frame is a component of the display housing of one of the two or more displays, or is unadjustably connected to the display housing of one of the two or more displays.

5. The display device according to claim 1, wherein the at least one compensating element comprises a threaded bush in one of the display housings in which an adjusting screw engages.

6. The display device according to claim 5, wherein a compensating bush is arranged between the threaded bush and the adjusting screw.

7. The display device according to claim 1, wherein the at least one compensating element comprises a threaded rod with lock nuts.

8. The display device according to claim 1, wherein the at least one compensating element comprises a fastening lug of the holding frame to which one of the display housings is laterally fastened.

9. The display device according to claim 1, wherein contact surfaces between a display housing and the holding frame have an adhesive bond.

10. A method for producing a display device with two or more displays in a dashboard of a motor vehicle, wherein the two or more displays have display housings and are optically bonded to a cover pane, with the steps:
fastening a first display to a holding frame, which holding frame has fastening points for the dashboard;
aligning the first display flush next to a second display that is connected to the holding frame by means of at least one compensating element of the display device; wherein the compensating element allows at least linear positioning of the two or more displays relative to each other along an axis, perpendicular to the cover pane; and
mounting the display device in the dashboard of the motor vehicle.

11. The method according to claim 10, wherein contact surfaces between a display housing and a holding frame are glued.

12. A motor vehicle with a display device according to claim 1.

13. The display device according to claim 1, wherein the holding frame is arranged on a backside of the two or more displays.

14. The display device according to claim 1, wherein the holding frame extends substantially along a backside of the two or more displays.

15. The display device according to claim 1, wherein the holding frame is arranged substantially parallel to the display housing of at least one of the two or more displays.

16. The display device according to claim 1, wherein the at least one compensating element is integrated with one or more of the holding frame and the display housing of at least one of the two or more displays.

17. The display device according to claim 1, wherein a first display of the two or more displays provides an instrument cluster.

18. The display device according to claim 1, wherein a second display of the two or more displays provides an infotainment display.

19. The display device according to claim 1, wherein a display size of a first display of the two or more displays differs from a display size of a second display of the two or more displays.

* * * * *